United States Patent [19]

Sasaki

[11] 3,882,331

[45] May 6, 1975

[54] HYSTERESIS CIRCUITS USING INSULATED GATE FIELD EFFECT TRANSISTORS

[75] Inventor: Minoru Sasaki, Tokyo, Japan

[73] Assignee: Tokyo Shibaura Electric Co., Ltd., Tokyo, Japan

[22] Filed: Feb. 28, 1974

[21] Appl. No.: 446,726

[30] Foreign Application Priority Data

Mar. 5, 1973 Japan .............................. 48-25163

[52] U.S. Cl. .............................. 307/279; 307/290

[51] Int. Cl. .. H03k 3/286; H03k 3/295; H03k 3/33

[58] Field of Search ............ 307/279, 289, 290, 291

[56] References Cited

UNITED STATES PATENTS 3,474,264 10/1969 Hughes .............................. 307/290

3,483,400 12/1969 Washizuka et al. ............ 307/289 X

FOREIGN PATENTS OR APPLICATIONS 1,948,603 4/1971 Germany .......................... 307/290

*Primary Examiner*—Michael J. Lynch
*Assistant Examiner*—L. N. Anagnos
*Attorney, Agent, or Firm*—Oblon, Fisher, Spivak, McClelland & Maier

[57] ABSTRACT

A hysteresis circuit using MOS (metal oxide semiconductor) field effect transistors for switching output voltage levels in response to different input voltage levels, wherein a voltage dividing circuit is connected between the input and output terminals of the hysteresis circuit; and input voltage levels switching output voltage levels are controlled in response to an output voltage from the voltage dividing circuit.

11 Claims, 5 Drawing Figures

HYSTERESIS CIRCUITS USING INSULATED GATE FIELD EFFECT TRANSISTORS

This invention relates to a hysteresis circuit and more particularly to a hysteresis circuit using insulated gate field effect transistors.

A hysteresis circuit is the one wherein an input voltage level associated with the rise in the level of an output voltage is different from an input voltage level associated with the fall of the output voltage level, and is generally used as a wave shaping circuit such as a Schmitt circuit for the purpose of reducing noise sensitivity.

A prior art hysteresis circuit using MOS field effect transistors comprises an input circuit including a first switchable MOS transistor for generating control signals in accordance with input voltage levels; an output circuit including a second switchable MOS transistor for switching output voltage levels in response to the control signals; and a third switchable MOS transistor connected in series with the first MOS transistor to control input voltage levels for switching output voltage levels in response to the output voltage levels.

According to the above-mentioned prior art hysteresis circuit, where an N channel enhancement mode type MOS transistor is used and an input voltage level rises above the drain potential of the third MOS transistor or the source potential of the first MOS transistor by the threshold voltage of the first MOS transistor, then the first MOS transistor is turned on. A control signal generated as the result turns off the second MOS transistor, and in consequence an output voltage of the hysteresis circuit is switched from a first to a second level. The third MOS transistor is turned on in response to the second output voltage level, causing the source potential of the first MOS transistor to fall to a referential potential. The above-mentioned circuit condition remains unchanged even when the input voltage level is raised. Where the input voltage level is lowered to below the threshold voltage of the first MOS transistor, then the first MOS transistor is turned off, causing the output voltage to be reversely switched from the second to the first level.

Such prior art hysteresis circuit is subjected to a restriction that where the first MOS transistor is turned on, the drain potential of the third MOS transistor should have a smaller value than the threshold voltage of the second MOS transistor, otherwise the second MOS transistor would cease to be turned off when it is so desired. The above-mentioned conventional hysteresis circuit, therefore, has a hysteresis band width corresponding to the magnitude of variation in the drain potential of the third MOS transistor. Namely, the width or upper limit of hysteresis band is restricted by the threshold voltage of the second MOS transistor. Where an input voltage level defining the upper limit of hysteresis band is thus restricted by the threshold voltage of the second MOS transistor or output transistor, then it will be difficult to design a hysteresis circuit. The aforesaid prior art hysteresis circuit may be exemplified by the type set forth in U.S. Pat. No. 3,612,908 issued to Heimbigner on Oct. 29, 1971.

It is accordingly the object of this invention to provide a hysteresis circuit whose hysteresis band width or the upper limit of hysteresis band is not affected by the threshold voltage of an output transistor.

According to the hysteresis circuit of this invention, a voltage division circuit means is connected between input and output terminals of the hysteresis circuit. A third transistor controls input voltage levels for switching output voltage levels in response to an output from the voltage division circuit. Even when an input voltage level reaches the threshold voltage of the first transistor to turn it on, the output voltage appearing at the voltage dividing point on the voltage division circuit means does not reach the threshold voltage of the third transistor, preventing it from being turned on. Where an output from the voltage division circuit reaches the threshold voltage of the third transistor due to the rise of an input voltage level, then the third transistor becomes on. A control signal generated as the result turns the second transistor on to switch the level of an output voltage. The positive feedback operation of the voltage division circuit means connected to the output terminal of the hysteresis circuit keeps the third transistor on. When an input voltage level falls to below the threshold voltage of the first transistor, then the first transistor is turned off, causing an output voltage to be changed. As described above, the hysteresis circuit of this invention enables the width or upper limit of hysteresis band to be freely chosen by the voltage division circuit without being restricted by the threshold voltage of the second transistor.

This invention can be more fully understood from the following detailed description when taken in conjunction with the accompanying drawings, in which.

Figure 3:
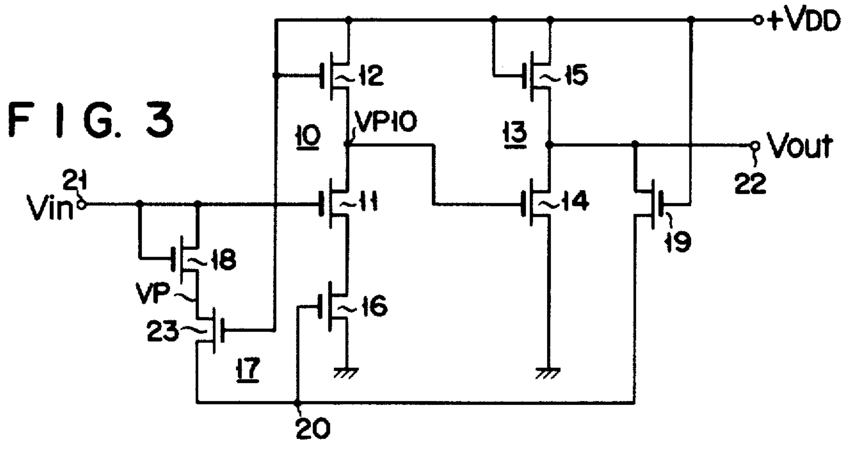
FIG. 3 represents a circuit diagram according to another embodiment of the invention.
Figure 4:
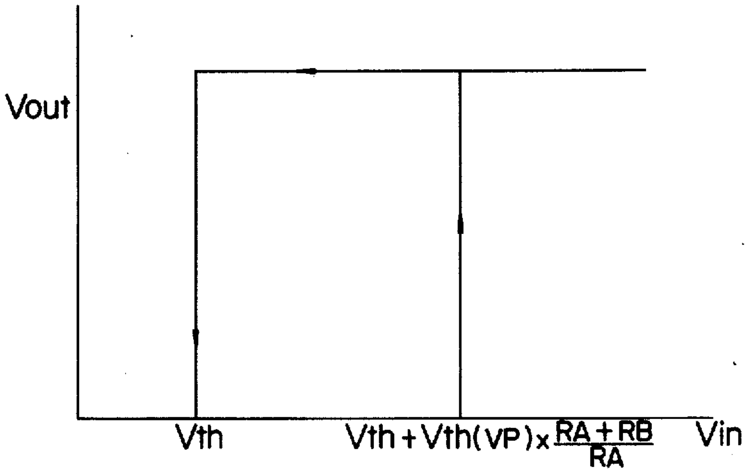
Figure 5:
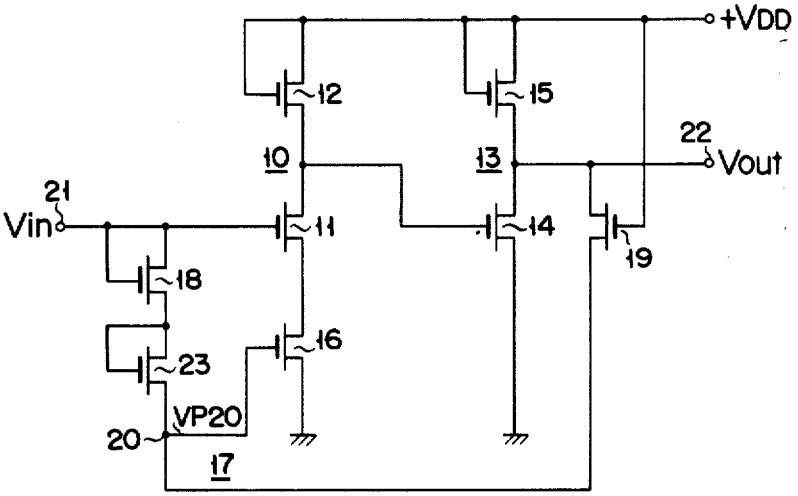

FIG. 4 schematically illustrates the characteristics of the hysteresis circuit of FIG. 3; and FIG. 5 indicates a circuit diagram according to still another embodiment.

Figure 1:
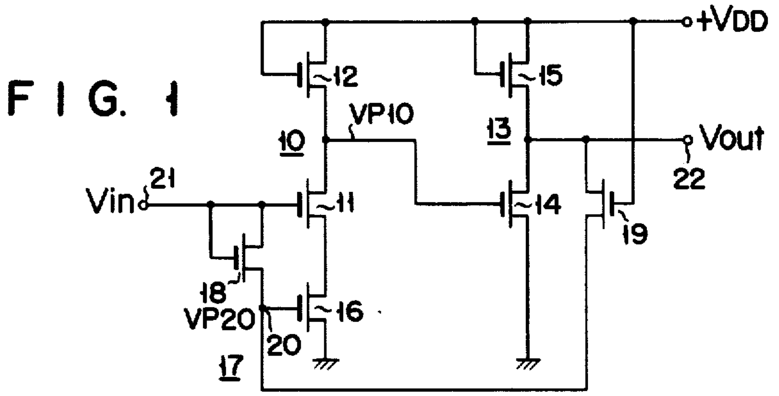
FIG. 1 shows a circuit diagram according to an embodiment of this invention.

Referring to FIG. 1, an input or first circuit 10 includes a switchable MOS transistor 11 whose gate is connected to an input terminal 21 and a load MOS transistor 12 whose gate and drain are connected to a power source of positive potential $+V_{DD}$ and whose source is connected to the drain of the transistor 11. An output or second circuit 13 includes a switchable MOS transistor 14 whose gate is connected to the drain of the transistor 11 and whose source is connected to a referential potential point or ground and a load MOS transistor 15 whose gate and drain are connected to the power source of positive potential and whose source is connected to the drain of the transistor 14. The drain of the transistor 14 is also connected to an output terminal 22. The source of the switchable MOS transistor 11 of the first circuit 10 is connected to the drain of a switchable MOS transistor 16 whose source is connected to the referential potential point. Connected between the input terminal 21 and output terminal 22 is a voltage division circuit means 17 which includes an MOS transistor 18 whose gate and drain are connected to the input terminal 21 and another MOS transistor 19 whose gate is connected to the power source of positive potential, whose source is connected to the output terminal 22 and whose drain is connected to the source of the aforesaid MOS transistor 18. The junction or voltage dividing point 20 of the source of the MOS transistor 18 and the drain of the MOS transistor 19 is connected to the gate of the MOS transistor 16. While N channel enhancement mode type MOS transistors are used in the hysteresis circuit of FIG. 1, it is also possible to use P channel type MOS transistors. In such case, however, a power source of negative potential is used.

There will now be described by reference to FIG. 1 the operation of the hysteresis circuit according to an embodiment of this invention. Let it be assumed that the threshold voltage of the switchable MOS transistors 11, 14, 16 and 18 is $V_{th}$ and an input voltage impressed on the input terminal 21 initially has a zero level. Then the transistors 11 and 18 are off, and the transistor 14 is on. Accordingly, an output voltage appearing at the output terminal 22 has a zero level, and in consequence the transistor 16 is off. To simplify description, the switchable MOS transistors 11, 14 and 16 are assumed to have an ideal switching property.

Figure 2:
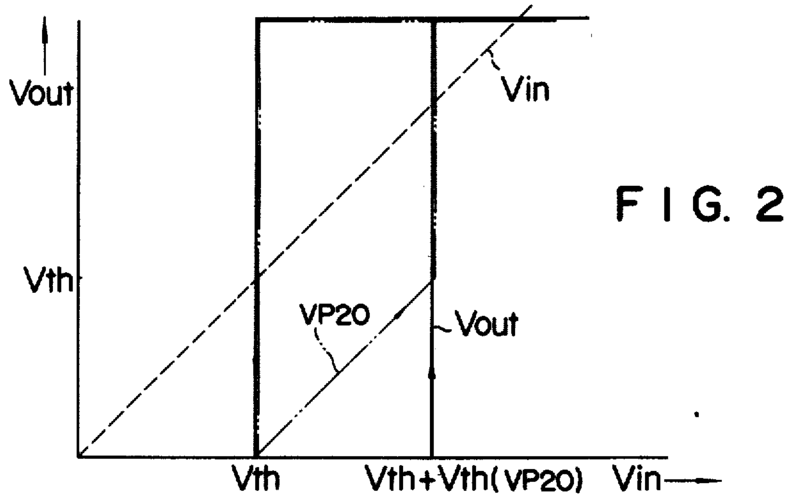
FIG. 2 is a characteristic diagram schematically illustrating the operation of the hysteresis circuit of FIG. 1.

When an input voltage $V_{in}$ rises, as shown in FIG. 2, from a zero level to the threshold voltage $V_{th}$, then the transistors 11 and 18 begin to turn on. However, the gate voltage VP20 of the transistor 16 is lower than the input voltage $V_{in}$ ($=V_{th}$) by the threshold voltage $V_{th}$ of the transistor 18, namely, has a zero level, keeping the transistor 16 off. Therefore, an output voltage VP10 from the input circuit 10 does not change in level and consequently an output voltage $V_{out}$ continues to have the zero volt. Where the input voltage $V_{in}$ rises over the threshold voltage $V_{th}$, then the gate voltage VP20 of the transistor 16 increases as shown in FIG. 2. When the gate voltage VP20 reaches the threshold voltage $V_{th}$ of the transistor 16, then the transistor 16 is turned on. As the result, the output voltage VP10 from the input circuit 10 falls toward the zero volt, causing the transistor 14 of the output circuit 13 to be rendered off and the output voltage $V_{out}$ to rise toward the power source voltage $+V_{DD}$. Since the output voltage $V_{out}$ is positively fed back to the gate of the transistor 16 through the transistor 19, the gate voltage VP20 also rises toward the power source voltage $+V_{DD}$ as indicated in FIG. 2. At this time, the transistor 18 is made to turn off.

The switchover of the output voltage $V_{out}$ from the first level (0 volt) to the second level ($+V_{DD}$ volts) through the operation of the transistor 16 takes place only when the undermentioned condition is satisfied.

$$V_{in} - V_{th}\,(VP20) \geqq V_{th}$$

Namely, when the input voltage $V_{in}$ reaches a level of $V_{th} + V_{th}\,(VP20)$, then an output voltage has its level switched. $V_{th}$ (VP20) shows that the threshold voltage $V_{th}$ of the transistor 18 varies as a function of the output voltage from said transistor 18 or the source voltage VP20 thereof. Where the threshold voltage $V_{th}$ of the transistor 18 is assumed to have about 5 volts and the input voltage $V_{in}$ to the hysteresis circuit reaches about 12 volts, then the output voltage $V_{out}$ from the hysteresis circuit has its level switched.

When the input voltage $V_{in}$ is progressively reduced, the transistor 11 remains on until the input voltage $V_{in}$ falls to the level of $V_{th}$, and the transistor 16 also remains on, because the output voltage $V_{out}$ is positively fed back to the gate of the transistor 16, causing the output voltage $V_{out}$ to be maintained at the second level. When the input voltage reaches the level of $V_{th}$, the transistor 11 is turned off. As a result, the output voltage VP10 from the input circuit 10 rises to make transistor 14 to turn on, causing the output voltage $V_{out}$ to be switched from the second to the first level. In the hysteresis circuit of FIG. 1, the upper limit of hysteresis band is about 12 volts and the lower limit thereof is about 5 volts as mentioned above, namely, providing a hysteresis band width of about 7 volts.

The load transistors 12 and 15 and the dividing transistors 18 and 19 included in the hysteresis circuit of FIG. 1 may be replaced by ordinary resistor elements. In this case, the hysteresis band width can be freely determined by selection of values of the dividing resistors. Namely, assuming that the values of resistors corresponding to the transistors 18 and 19 are RA and RB respectively, then the upper limit of the hysteresis band is provided by $V_{th} \times (RA+RB)/RB$. If, however, the dividing transistor 18 is substituted by a resistor element, then current will always pass through the resistor element, leading to the large power dissipation of the hysteresis circuit. Further, if an input voltage $V_{in}$ to the hysteresis circuit is reduced while the output voltage $V_{out}$ stands at the second level, then the output voltage $V_{out}$ will undesirably have its level gradually decreased. Therefore, it is preferred to use the switchable transistor 18 without replacing it by a resistor element.

FIG. 3 shows a modification of FIG. 1. There is provided an additional transistor 23 having its drain connected to the source of transistor 18; its source connected to the output point 20 of the voltage dividing circuit 17 and its gate connected to the $+V_{DD}$ source. Where, in the hysteresis circuit of FIG. 3, too, a potential at the output point 20 on the voltage division circuit 17 rises above the threshold voltage $V_{th}$ of the transistor 16, then the output voltage $V_{out}$ from the hysteresis circuit is switched from the first to the second level. In the hysteresis circuit of FIG. 3, the potential at the output point 20 is equal to a value arrived at by dividing the source potential of the transistor 18 by the transistors 19 and 23. Therefore, the input condition required for the transistor 16 to turn on may be defined as follows:

$$\{V_{in} - V_{th}(VP)\}\, RA/(RA+RB) \geqq V_{th}$$

where:

*RA* and *RB* = resistances indicated by the transistors 19 and 23

*VP* = source potential of the transistor 18 corresponding to VP20 of FIG. 1.

Where the input voltage $V_{in}$ reaches a level of $V_{th}(VP) + V_{th} \times (RA+RB)/RA$, then the transistor 16 begins to turn on, causing the output voltage $V_{out}$ to be changed from the first to the second level. Where the input voltage $V_{in}$ to the hysteresis circuit falls to the threshold voltage $V_{th}$, the transistor 11 begins to turn off, and in consequence the output voltage $V_{out}$ falls from the second to the first level. FIG. 4 illustrates the characteristics of the hysteresis circuit of FIG. 3. It will be understood from FIG. 4 that the width and upper limit of hysteresis band can be freely defined by selection of the resistance values RA and RB of the transistors 19 and 23.

In the hysteresis circuit of FIG. 5, the transistor 23 has its gate connected to its drain. As easily inferred from the hysteresis circuit of FIG. 1, where the input voltage $V_{in}$ reaches a level of $2V_{th} + V_{th}$ (VP20) in the embodiment of FIG. 5, then the output voltage $V_{out}$ rises from the first to the second level. Namely, the embodiment of FIG. 5 enables the width and upper limit of hysteresis band to be more increased than in that of FIG. 1. In the hysteresis circuit of FIG. 5, it is possible to provide an additional transistor between the transistor 23 and the output point 20 on the voltage division circuit 17 with its gate connected to the power source or its own drain.

What is claimed is:

1. A hysteresis circuit comprising: an input means; an output means; first circuit means coupled to said input means and including a first switchable impedance means for generating control signals in response to input voltage levels; second circuit means including a second switchable impedance means for switching output voltage levels impressed on said output means in response to said control signals; voltage dividing circuit means connected between said input and output means; and third switchable impedance means connected in circuit with said first switchable impedance means for controlling input voltage levels switching output voltage levels in response to outputs from said voltage dividing circuit means; said third switchable impedance means is connected in series with said first switchable impedance means.

2. A hysteresis circuit according to claim 1 wherein said first, second and third switchable impedance means consist of insulated gate field effect transistors.

3. A hysteresis circuit according to claim 1 wherein said voltage dividing circuit means includes first and second impedance means.

4. A hysteresis circuit according to claim 3 wherein said first impedance means includes a fourth switchable impedance means which is rendered on in response to an input voltage level.

5. A hysteresis circuit according to claim 4 wherein said fourth switchable impedance means consists of an insulated gate field effect transistor.

6. A hysteresis circuit according to claim 1 wherein said first circuit means includes a first insulated gate field effect transistor whose gate is connected to said input means and a second field effect transistor whose drain and gate are jointly connected to a potential source and whose source is connected to the drain of said first field effect transistor; said second circuit means includes a third field effect transistor whose gate is connected to the junction of the drain of said first field effect transistor and the source of said second field effect transistor and whose source is connected to a referential potential point, and a fourth field effect transistor whose gate and drain are jointly connected to the potential source and whose source is connected to the drain of said third field effect transistor and to said output means; and said voltage dividing circuit means includes a fifth field effect transistor whose gate and drain are jointly connected to said input means and a sixth field effect transistor whose gate is connected to the potential source, whose source is connected to said output means and whose drain is connected to the source of said fifth field effect transistor; and said third switchable impedance means includes a seventh field effect transistor whose gate is connected to a voltage division point between the source of said fifth field effect transistor and the drain of said sixth field effect transistor, whose drain is connected to the source of said first field effect transistor and whose source is connected to the referential potential point.

7. A hysteresis circuit according to claim 6 wherein said voltage dividing circuit means includes an eighth field effect transistor whose source is connected to the voltage dividing point, whose drain is connected to the source of said fifth field effect transistor and whose gate is connected to the potential source.

8. A hysteresis circuit according to claim 6 wherein said voltage dividing circuit means includes an eighth field effect transistor whose source is connected to the voltage dividing point and whose drain and gate are jointly connected to the source of said fifth field effect transistor.

9. A hysteresis circuit using insulated gate field effect transistors each having drain, source and gate electrodes, said hysteresis circuit comprising:

a potential source;

input and output terminals;

a first transistor having the gate connected to said input terminal;

a second transistor having the gate and drain connected to said potential source and the source connected to the drain of said first transistor;

a third transistor having the drain connected to the source of said first transistor and the source connected to a reference potential point;

a fourth transistor having the gate connected to the drain of said first transistor and the source connected to the reference potential point;

a fifth transistor having the drain and gate connected to said potential source and the source connected to said output terminal and the drain of said fourth transistor;

a sixth transistor having the drain and gate connected to said input terminal and the source connected to the gate of said third transistor; and a seventh transistor having the drain connected to the source of said sixth transistor, the source connected to said output terminal and the gate connected to said potential source.

10. A hysteresis circuit using insulated gate field effect transistors each having drain, source and gate electrodes, said hysteresis circuit comprising:

a potential source;

input and output terminals;

a first transistor having the gate connected to said input terminal;

a second transistor having the gate and drain connected to said potential source, and the source connected to the drain of said first transistor;

a third transistor having the drain connected to the source of said first transistor and the source connected to a reference potential point;

a fourth transistor having the gate connected to the drain of said first transistor and the source connected to the reference potential point;

a fifth transistor having the drain and gate connected to said potential source and the source connected to said output terminal and the drain of said fourth transistor;

a sixth transistor having the drain and gate connected to said input terminal;

a seventh transistor having the drain connected to the source of said sixth transistor, the gate connected to said potential source and the source connected to the gate of said third transistor; and an eighth transistor having the source connected to said output terminal, the gate connected to said potential source and the drain connected to the source of said seventh transistor.

11. A hysteresis circuit using insulated gate field effect transistors each having drain, source and gate electrodes, said hysteresis circuit comprising:

a potential source;

input and output terminals;

a first transistor having the gate connected to said input terminal;

a second transistor having the gate and drain connected to said potential source, and the source connected to the drain of said first transistor;

a third transistor having the drain connected to the source of said first transistor and the source connected to a reference potential point;

a fourth transistor having the gate connected to the drain of said first transistor and the source connected to the reference potential point;

a fifth transistor having the drain and gate connected to said potential source and the source connected to said output terminal and the drain of said fourth transistor;

a sixth transistor having the drain and gate connected to said input terminal;

a seventh transistor having the drain and gate connected to the source of said sixth transistor, and the source connected to the gate of said third transistor; and an eighth transistor having the source connected to said output terminal, the gate connected to said potential source and the drain connected to the source of said seventh transistor.

* * * * *